(12) United States Patent
Choi et al.

(10) Patent No.: US 12,469,726 B2
(45) Date of Patent: Nov. 11, 2025

(54) SEMICONDUCTOR PROCESSING DEVICE AND SEMICONDUCTOR PROCESSING SYSTEM

(71) Applicant: Samsung Electronics Co., Ltd., Suwon-si (KR)

(72) Inventors: Hyunwoong Choi, Suwon-si (KR); Kongwoo Lee, Suwon-si (KR); Beomsoo Hwang, Suwon-si (KR); Myungki Song, Suwon-si (KR); Kyusang Lee, Suwon-si (KR); Jinhyuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 235 days.

(21) Appl. No.: 18/217,020

(22) Filed: Jun. 30, 2023

(65) Prior Publication Data

US 2024/0178025 A1 May 30, 2024

(30) Foreign Application Priority Data

Nov. 24, 2022 (KR) .................. 10-2022-0159519

(51) Int. Cl.
*H01L 21/67* (2006.01)
*H01L 21/677* (2006.01)
*H01L 21/68* (2006.01)

(52) U.S. Cl.
CPC .. *H01L 21/67288* (2013.01); *H01L 21/67265* (2013.01); *H01L 21/67742* (2013.01); *H01L 21/681* (2013.01)

(58) Field of Classification Search
CPC ......... H01L 21/67288; H01L 21/67265; H01L 21/67742; H01L 21/681
See application file for complete search history.

(56) References Cited

U.S. PATENT DOCUMENTS

| 8,025,475 B2 * | 9/2011 | Wakabayashi .... H01L 21/67748 414/744.5 |
| 2009/0066933 A1 * | 3/2009 | Takano .................. H01L 22/12 356/32 |

(Continued)

FOREIGN PATENT DOCUMENTS

| KR | 1020040038998 A | 5/2004 |
| KR | 1020120045309 A | 5/2012 |

(Continued)

*Primary Examiner* — Kevin K Pyo
*Assistant Examiner* — Don J Williams
(74) *Attorney, Agent, or Firm* — Muir Patent Law, PLLC

(57) ABSTRACT

A semiconductor processing device includes a stage configured to receive a bare wafer placed thereon, a laser sensor located above the stage in a vertical direction, orthogonal to an upper surface of the bare wafer, a camera sensor located above the stage in a first direction, a lighting device radiating an imaging region imaged by camera sensor with light, and a controller, configured to rotate the bare wafer using the stage, obtain a plurality of sub-images of the bare wafer captured by the camera sensor to generate an original image of the bare ware, and detect a first defect of the bare wafer using the original image, wherein the controller is configured to detect a second defect of the bare wafer by measuring a distance between the laser sensor and the bare wafer, while rotating the bare wafer using the stage.

20 Claims, 13 Drawing Sheets

(56) References Cited

U.S. PATENT DOCUMENTS

| | | | |
|---|---|---|---|
| 2010/0067779 A1 | 3/2010 | Reich et al. | |
| 2019/0013224 A1* | 1/2019 | Chiba | H01L 21/68771 |
| 2019/0035696 A1 | 1/2019 | Lin et al. | |
| 2019/0250108 A1 | 8/2019 | Sachs et al. | |
| 2020/0024726 A1* | 1/2020 | Moradian | H01L 21/67748 |
| 2020/0043812 A1 | 2/2020 | Lin et al. | |
| 2022/0128485 A1 | 4/2022 | Hsiao et al. | |
| 2022/0138922 A1 | 5/2022 | Nomura et al. | |
| 2022/0261976 A1 | 8/2022 | Lee et al. | |
| 2022/0384278 A1* | 12/2022 | Wong | H01L 21/67259 |

FOREIGN PATENT DOCUMENTS

| | | |
|---|---|---|
| KR | 1020190013464 A | 2/2019 |
| KR | 1020200030403 A | 3/2020 |
| KR | 102134035 B1 | 7/2020 |
| KR | 1020210092001 A | 7/2021 |

\* cited by examiner

SEMICONDUCTOR PROCESSING DEVICE AND SEMICONDUCTOR PROCESSING SYSTEM

CROSS-REFERENCE TO RELATED APPLICATION(S)

This application claims priority to Korean Patent Application No. 10-2022-0159519 filed on Nov. 24, 2022 in the Korean Intellectual Property Office, the disclosure of which is incorporated herein by reference in its entirety.

BACKGROUND

The present inventive concept relates to a semiconductor processing device and a semiconductor processing system, and a method of processing a semiconductor device.

Processing apparatuses performing a semiconductor process include a wafer transfer robot transferring wafers, and the wafer transfer robot may transfer wafers between various transfer structures for transferring and/or storing wafers and between process chambers. Defects, such as scratches, may occur on a wafer surface or warpage may occur on the wafer due to external force in the process of transferring the wafers between various chambers in which a semiconductor process is performed or in the process of performing a process on the wafers. Therefore, there is a need for a method capable of efficiently determining various defects that may occur during wafer transfer and semiconductor processing.

SUMMARY

An aspect of the present inventive concept is to provide a semiconductor processing device and a semiconductor processing system in which a camera sensor and a laser sensor are mounted in an aligner included in the semiconductor processing device to align a wafer, and a defect present on a surface of the wafer is determined based on an image captured by the camera sensor, and a warpage defect or the like of the wafer is determined based on distance information measured by the laser sensor, thereby efficiently determining the defects of the wafer without separate inspection equipment.

According to an aspect of the present inventive concept, a semiconductor processing device includes: a stage configured to receive a bare wafer placed thereon; a laser sensor located above the stage in a vertical direction, orthogonal to an upper surface of the bare wafer; a camera sensor located above the stage in a first direction; a lighting device radiating an imaging region imaged by camera sensor with light; and a controller configured to rotate the bare wafer using the stage, obtain a plurality of sub-images of the bare wafer captured by the camera sensor to generate an original image of the bare ware, and detect a first defect of the bare wafer using the original image, wherein the controller is configured to detect a second defect of the bare wafer by measuring a distance between the laser sensor and the bare wafer, while rotating the bare wafer using the stage.

According to another aspect of the present inventive concept, a semiconductor processing device includes: a wafer transfer robot including a hand unit for gripping a wafer and a driving unit connected to the hand unit for moving the wafer; an aligner including a stage on which the wafer is seated, a camera sensor installed above the stage to image a partial region of the wafer at a time, and a laser sensor installed above the stage to measure a distance to a surface of the wafer; and a controller configured to control the wafer transfer robot and the aligner. The controller is configured such that, when the wafer is seated on the stage, the controller acquires a plurality of sub-images of a partial region of the wafer captured by the camera sensor, while rotating the wafer using the stage, and determines a surface defect of the wafer using the plurality of sub-images, and the controller determines a curve defect of the wafer based on a distance to a surface of the wafer measured by the laser sensor, while rotating the wafer using the stage.

According to another aspect of the present inventive concept, a semiconductor processing device includes: at least one process chamber configured to perform a semiconductor process on a wafer; a wafer transfer robot configured to move the wafer transferred by a front open unified pod (FOUP); an aligner configured to receive the wafer from the wafer transfer robot and rotate the wafer to align the wafer in a predetermined direction; and a load-lock chamber configured to transfer the wafer between the process chamber and the wafer transfer robot, wherein the aligner includes a stage rotating the wafer, an aligning sensor mounted above the stage and configured to recognize a notch or a flat zone of the wafer, a lighting device mounted above the stage and configured to irradiate a partial region of the wafer with light, a camera sensor mounted above the stage and configured to image a partial region of the wafer, and a laser sensor mounted above the stage and configured to measure a distance to an upper surface of the wafer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
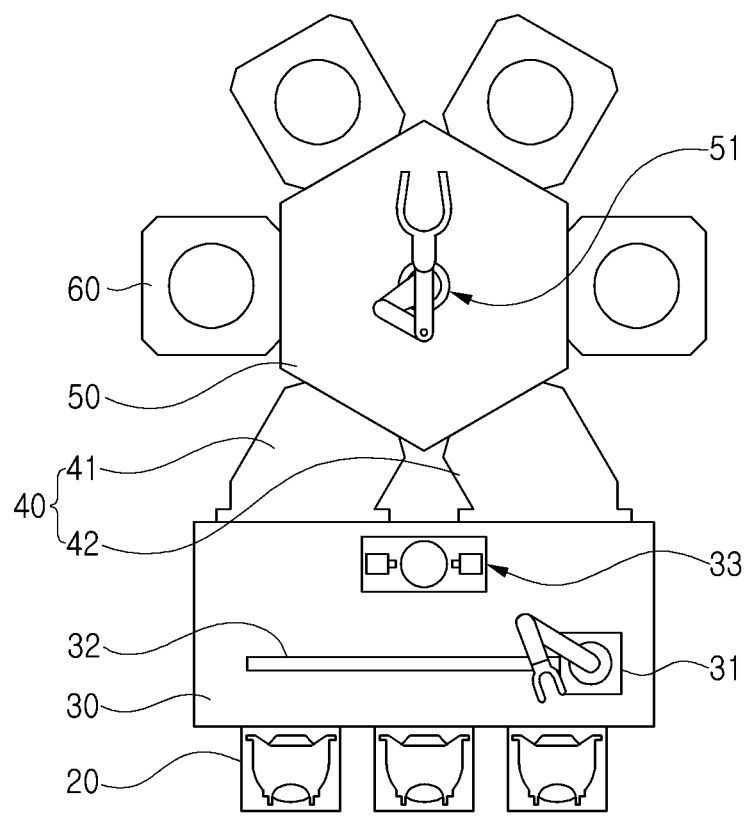
FIG. 1 is a schematic diagram illustrating a semiconductor processing system according to an embodiment of the present inventive concept.

FIG. 1 is a schematic diagram illustrating a semiconductor processing system according to an embodiment of the present inventive concept.

Referring to FIG. 1, a semiconductor processing system 10 according to an embodiment of the present inventive concept may include a semiconductor processing device 30, a load-lock chamber 40, a transfer chamber 50, and a plurality of process chambers 60. For example, the semiconductor processing device 30 may be a wafer transfer device and may receive wafers through a container, such as a front open unified pod (FOUP) 20 in a line in which the semiconductor processing system 10 is disposed. The semiconductor processing device 30 may transfer the wafers received through the FOUP 20 to the load-lock chamber 40, or receive wafers on which semiconductor processing has been completed in the process chambers 60 from the load-lock chamber 40, and accommodate the received wafers in the FOUP 20.

The semiconductor processing device 30 may include a wafer transfer robot 31 having an arm capable of gripping a wafer, a rail unit 32 moving the wafer transfer robot 31, and an aligner 33 aligning the wafer. The rail unit 32 may include one or more rails. The arm may include a hand unit for gripping the wafer. The hand unit may include, for example, fingers, or prongs. The wafer transfer robot 31 may also include a driving unit for moving the arm and hand unit. The driving unit may include a motor, actuator, or other device for moving the arm and hand unit. Assuming an operation of transferring a wafer from the FOUP 20 to the load-lock chamber 40, the wafer transfer robot 31 may take out the wafer stored in the FOUP 20 and place the wafer on the aligner 33. The aligner 33 may rotate the wafer to align the wafer in a predetermined direction. When wafer alignment is completed in the aligner 33, the wafer transfer robot 31 may take the wafer out of the aligner 33 and transfer the wafer to the load-lock chamber 40.

The load-lock chamber 40 may be connected to the semiconductor processing device 30 and may include a loading chamber 41 in which wafers carried out from the process chamber 60 temporarily remain for semiconductor processing and an unloading chamber 42 in which wafers transferred from the processing chamber 60 temporarily remain. When the wafers aligned in the aligner 33 are loaded into the loading chamber 41, the inside of the loading chamber 41 may be depressurized to prevent external contaminants from entering.

The load-lock chamber 40 may be connected to the transfer chamber 50, and a plurality of process chambers 60 may be connected around the transfer chamber 50. A wafer transfer robot 51 may be disposed inside the transfer chamber 50 to transfer wafers between the load-lock chamber 40 and the plurality of process chambers 60. The wafer transfer robot 31 of the semiconductor processing device 30 may be referred to as a first wafer transfer robot, and the wafer transfer robot 51 of the transfer chamber 50 may be referred to as a second wafer transfer robot.

Each of the plurality of process chambers 60 may perform a semiconductor process on the wafer. For example, a semiconductor process performed by the plurality of process chambers 60 may include a deposition process, an etching process, an exposure process, an annealing process, a polishing process, an ion implantation process, and the like.

In the semiconductor processing system 10, a transfer operation of moving the wafer transferred through the FOUP 20 to the load-lock chamber 40, introducing the wafer to at least one of the plurality of process chambers 60, performing a semiconductor process, and receiving the wafer carried out after the semiconductor process is completed, to the FOUP 20 again may be automatically performed. In the process of automatically performing the transfer operation as described above, the wafer is aligned in a predetermined direction and may be transferred between the FOUP 20, the semiconductor processing device 30, the load-lock chamber 40, the transfer chamber 50, and a plurality of process chambers 60. The wafer aligning operation may be performed in the aligner 33 of the semiconductor processing device 30, and the aligner 33 may provide a function of rotating the wafer. The aligner 33 may include a rotating platform or stage, for example.

When the wafer is stored in the FOUP 20 in a bare wafer state prior to semiconductor processing and transferred to the semiconductor processing system 10, the semiconductor processing system 10 may inspect whether the bare wafer has a defect before moving the bare wafer to one of the plurality of processing chambers 60 and performing a process. However, there may not be enough free space inside the semiconductor processing device 30 or the load-lock chamber 40 to prepare a separate stage to inspect whether the bare wafer has a defect. In addition, when a defect of the bare wafer removed from the FOUP 20 are inspected on a separate stage, the bare wafer is transferred to the aligner 33 to be aligned, and then introduced into the load-lock chamber 40, the efficiency of the overall process may deteriorate.

In an embodiment of the present inventive concept, by installing sensors for inspecting the bare wafer in the aligner 33, alignment and defect inspection of the bare wafer may be simultaneously performed. For example, a camera sensor and a laser sensor may be disposed above the stage of the aligner 33 on which the bare wafer is seated, and a first defect of the bare wafer may be determined based on an image of the bare wafer captured by the camera sensor, and a second defect of the bare wafer may be determined based on a distance to the bare wafer measured by the laser sensor. For example, the first defect may include scratches or cracks on the surface of the bare wafer, and the second defect may include warpage of the bare wafer.

In order to obtain an image including the entire area of the bare wafer by imaging the bare wafer with the camera sensor, a sufficient working distance between the camera sensor and the bare wafer should be secured or the camera sensor needs to provide a sufficiently wide angle of view. However, it may be difficult to sufficiently increase the working distance between the camera sensor and the bare wafer in consideration of an internal space of the semiconductor processing device 30 and the aligner 33. In addition, when the angle of view of the camera sensor is increased, distortion may occur in a partial region of the captured image of the bare wafer.

In an embodiment of the present inventive concept, a camera sensor having a general angle of view may be disposed in an appropriate position on the stage, and the bare wafer may be imaged, while rotating the bare wafer using a rotation function basically provided by the aligner 33. The camera sensor may generate a plurality of sub-images obtained by imaging a plurality of regions included in one bare wafer, and the controller of the semiconductor processing system 10 may configure an original image representing the entire area of the bare wafer with the plurality of sub-images. Therefore, regardless of the limited internal space of the semiconductor processing device 30 or the aligner 33, the original image without distortion obtained by imaging the bare wafer may be acquired, and defects present on the surface of the bare wafer may be accurately determined based on the original image.

Figure 2:
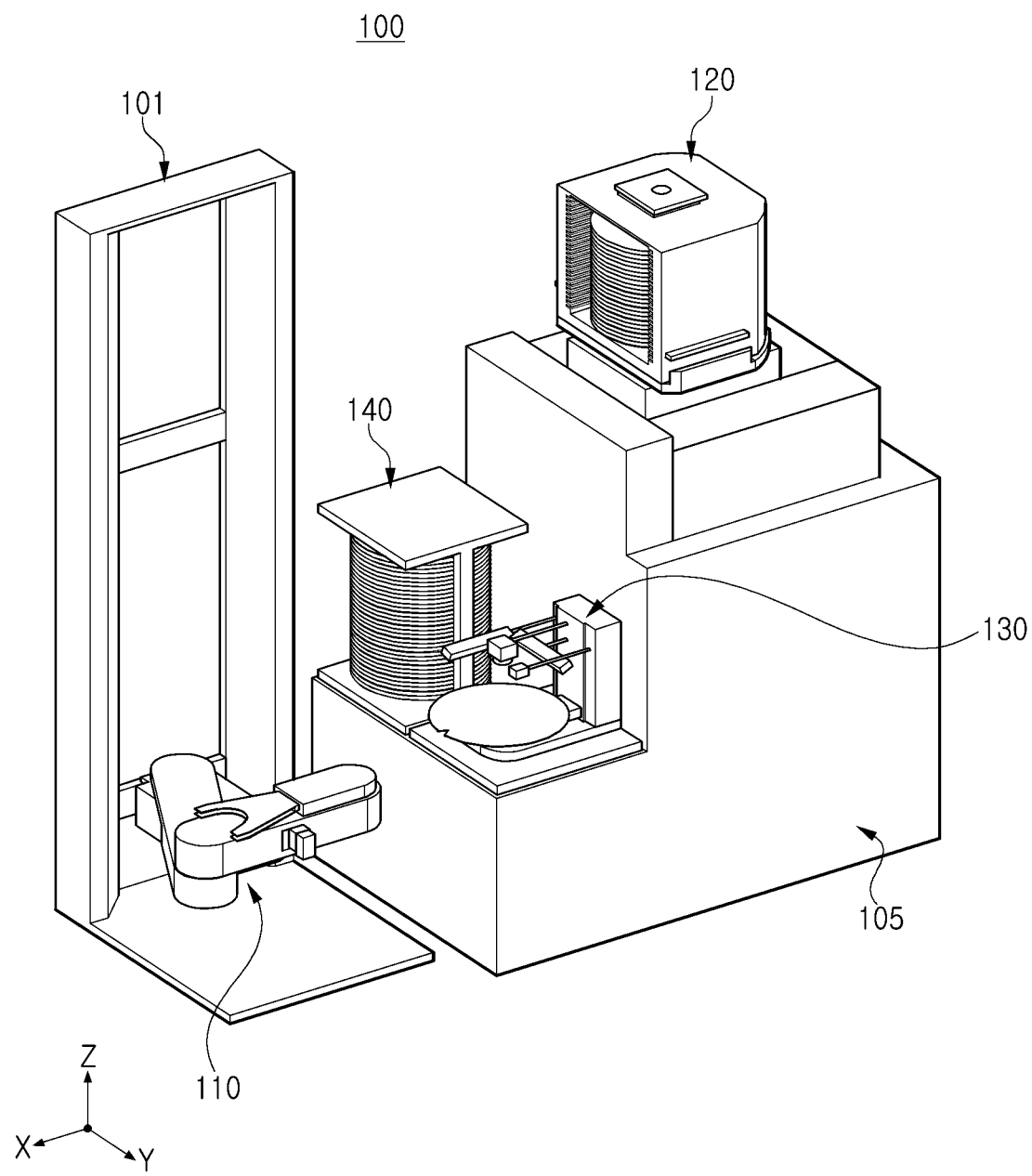
FIG. 2 is a schematic diagram of a semiconductor processing device according to an embodiment of the present inventive concept.

FIG. 2 is a schematic diagram of a semiconductor processing device according to an embodiment of the present inventive concept. The semiconductor processing device of FIG. 2 may be part of the semiconductor processing system 10 of FIG. 1.

Referring to FIG. 2, a semiconductor processing device 100 according to an embodiment of the present inventive concept may be an equipment front end module (EFEM) for carrying a wafer on which a semiconductor process is to be performed into the load-lock chamber and carrying a wafer on which a semiconductor process is completed out of the load-lock chamber. As shown in FIG. 2, the semiconductor processing device 100 may include a wafer transfer robot 110, a FOUP 120, an aligner 130, a buffer 140, and the like. However, the structure of the semiconductor processing device 100 is not limited as shown in FIG. 2 and may be modified in various ways according to embodiments.

The wafer transfer robot 110 may be mounted on a robot frame 101 and may transfer a wafer, while on the move. In the exemplary embodiment illustrated in FIG. 2, the wafer transfer robot 110 may move in the vertical direction (a Z-axis direction) along a rail mounted on the robot frame 101, but directions in which the robot 110 may move may vary according to a shape of the robot frame 101.

The transport structures FOUP 120, aligner 130, and buffer 140 may be mounted on the body 105. According to embodiments, a controller may be mounted in a space inside the body 105, and the controller may control the wafer transfer robot 110, the FOUP 120, the aligner 130, the buffer 140, and the like. For example, the controller controls the wafer transfer robot 110 to move the wafer, and executes a teaching operation of adjusting position information of the FOUP 120, the aligner 130, and the buffer 140 for the wafer transfer robot 110. In addition, the controller may rotate the wafer placed on the aligner 130 on a plane, parallel to an X-axis direction and a Y-axis direction to align the wafer in a predetermined direction. Therefore, the wafer may be always aligned in a certain direction when introduced into other devices, such as the load-lock chamber or the process chamber. Although not illustrated, the various controllers discussed herein can include one or more of the following components, at least some of which may be included or mounted in the body 105: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to adjust the operation of the controller (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the controller can include antennas, or network interfaces that provide wireless and/or wire line digital and/or analog interface to one or more networks over one or more network connections (not shown), a power source that provides an appropriate alternating current (AC) or direct current (DC) to power one or more components of the controller, and a bus that allows communication among the various disclosed components of the controller. The controller in the body 105 may be connected to the various components of the semiconductor processing device 100 to control movement and alignment of the wafer and to perform inspection of the wafer.

The FOUP 120 is a container that may be opened at the front and may accommodate a plurality of wafers, and may be transferred to the semiconductor processing device 100 by moving along a rail installed inside the line. After arriving at the semiconductor processing device 100, when the front of the FOUP 120 is opened to expose the wafers stored therein, the wafer transfer robot 110 may take out the wafer and transfer the wafer to the aligner 130. When a direction is aligned in the aligner 130, the wafer transfer robot 110 may remove the wafer and insert the wafer into the load-lock chamber connected to the process chamber.

When the wafer on which the semiconductor process is completed in the process chamber is carried out to the load-lock chamber, the wafer transfer robot 110 may withdraw the wafer from the load-lock chamber and accommodate the wafer in the buffer 140 or the FOUP 120 depending on the type of semiconductor process. For example, when the wafer is removed from the process chamber in which an etching process requiring a predetermined waiting time is performed after the semiconductor process is completed, the wafer transfer robot 110 may store the wafer in the buffer 140 first and then move the wafer to the FOUP 120. The buffer may be a raised platform, and/or may include an enclosed space.

In an embodiment of the present inventive concept, the aligner 130 may include components for inspecting wafer defects. For example, the aligner 130 may include a camera sensor, a laser sensor, and a lighting device irradiating the wafer with light, while inspecting defects on the wafer. A space in which the semiconductor processing device 100 is mounted may be maintained in a state in which light from the outside is blocked, and thus, without a separate lighting device, it may be difficult to capture an image of the wafer placed on the aligner 130 with sufficient sensitivity. In an embodiment of the present invention, a separate lighting device may be provided with the aligner 130 so that the controller may accurately determine defects of the wafer using the camera sensor and the laser sensor.

As described above, the aligner 130 may basically perform a function of rotating and aligning wafers in a predetermined direction, and may include a rotating platform. In an embodiment of the present inventive concept, a defect of the wafer may be effectively inspected, without moving the wafer to a separate stage, by using the rotation function of the aligner 130.

For example, the camera sensor may image the wafer, while rotating the wafer by the aligner 130. Since different regions of the wafer may be imaged by the camera sensor while the wafer is rotated by the aligner 130, a problem in which it is difficult to image all regions of the wafer at once by the camera sensor may be solved. The controller controls the aligner 130 to allow the camera sensor to perform a shutter operation two or more times, while rotating the wafer, thereby acquiring a plurality of sub-images of different regions of the wafer. The controller may acquire one original image in which the entire area of the wafer is displayed using a plurality of sub-images, and may detect a first defect, such as scratches and cracks, existing on the surface of the wafer based on the original image. For example, known image processing algorithms for merging the multiple images may be used to form a single image for inspection.

In addition, the controller may measure a distance between the laser sensor and the wafer surface using the laser sensor, while rotating the wafer by controlling the aligner 130, and determine a second defect, such as warpage of the wafer based on the measured distance. According to embodiments, the controller may measure the distance to the wafer surface, while moving the laser sensor in at least one direction. The operation of determining the first defect and the operation of determining the second defect may be sequentially executed and/or may be executed at least in part simultaneously.

Figure 3:
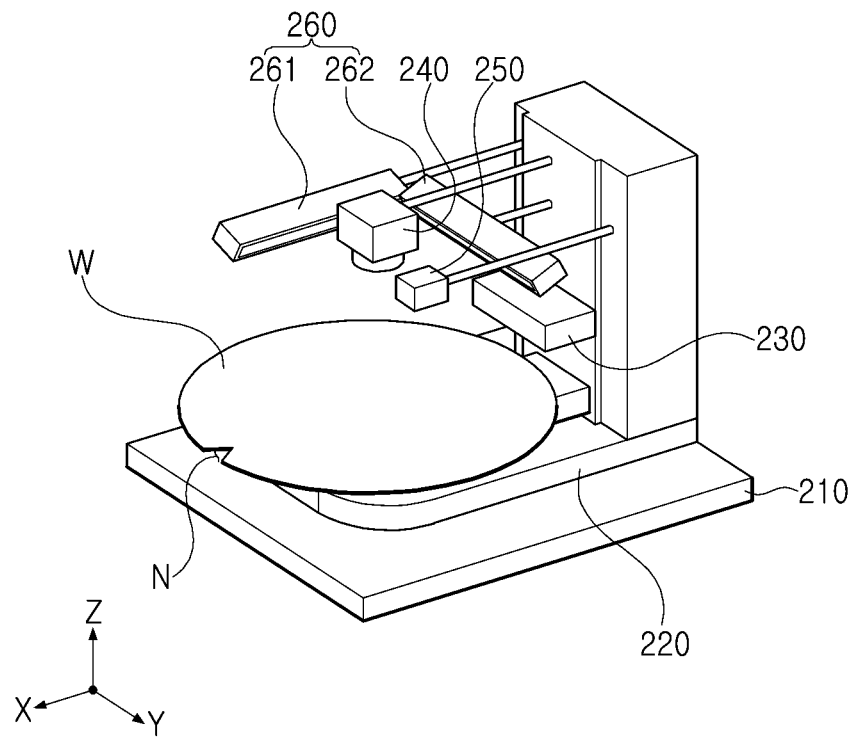
FIG. 3 is a schematic diagram of an aligner included in a semiconductor processing device according to an embodiment of the present inventive concept.

FIG. 3 is a schematic diagram of an aligner included in a semiconductor processing device according to an embodiment of the present inventive concept.

Referring to FIG. 3, an aligner 200 according to an embodiment of the present inventive concept may include a case 210, a stage 220 adjusting a direction of a wafer W, an aligning sensor 230 a camera sensor 240, a laser sensor 250, and a lighting device 260 mounted in the case 210. The stage 220 may rotate the wafer W clockwise and/or counterclockwise on a plane, parallel to a first direction (an X-axis direction) and a second direction (a Y-axis direction). The stage 220 may include a rotatable platform on which to mount the wafer. As an example, the wafer W may be a bare wafer before a semiconductor process is applied.

As shown in FIG. 3, the wafer W may include a notch N for determining a direction thereof. The aligning sensor 230 may recognize the notch N, while the stage 220 rotates the wafer W, and the wafer W may be withdrawn from the aligner 200 in a state in which the notch N is located below the aligning sensor 230.

However, according to embodiments, the wafer W may include a flat zone or other detectible indicator that may be recognized by the aligning sensor 230, instead of the notch N.

The camera sensor 240 and the laser sensor 250 may be disposed in a position higher than the aligning sensor 230 in a third direction (a Z-axis direction). For example, the camera sensor 240 may be disposed in a position higher than the laser sensor 250 in the third direction, and this may be to maximize an area that the camera sensor 240 may capture at a time.

However, due to the limitation of the space that the aligner 200 may occupy, it may be difficult to mount the camera sensor 240 in a position in which the camera sensor 240 may capture all areas of the wafer W at a single time. Instead, the camera sensor 240 having a very wide angle of view may be used, but in this case, distortion may occur in at least a partial region of an image captured by the camera sensor 240, and thus, defects of the wafer W may not be accurately detected.

In an embodiment of the present inventive concept, the camera sensor 240 may be mounted in an appropriate position at which the camera sensor 240 may image only a partial region of the wafer W at a single time. For example, the camera sensor 240 may be disposed in a position in which a partial region of the wafer W may be imaged without distortion (e.g., without any fisheye effect). The controller may acquire a first sub-image by imaging a first region of the wafer W by using the camera sensor 240, while rotating the wafer W by a first rotation angle using the stage 220. Next, the controller may rotate the wafer W by a second rotation angle using the stage 220 and image a second region of the wafer W by using the camera sensor to acquire a second sub-image. The controller may acquire a plurality of sub-images by repeating the above operation until all areas of the wafer W are imaged at least once, and configure an original image displaying the entire regions of the wafer W by using the plurality of sub-images.

The number of times the wafer W is imaged by the camera sensor 240 may vary depending on the area of the wafer W that may be imaged by the camera sensor 240 at a single time. For example, the area of the wafer W that may be imaged by the camera sensor 240 at a time may vary depending on the angle of view of the camera sensor 240 and the distance between the camera sensor 240 and the wafer W.

For example, the camera sensor 240 may image a region including a quadrant of the wafer W with one shutter operation. In this case, the controller may acquire first to fourth sub-images by imaging each of the four quadrants of the wafer W with the camera sensor 240, while rotating the wafer W by 90 degrees using the stage 220. The controller may generate an original image displaying the entire regions of the wafer W using the first to fourth sub-images.

In addition, the controller may measure the distance to the surface of the wafer W using the laser sensor 250, while rotating the wafer W using the stage 220, and based on this, the controller may determine a defect, such as warpage and a curve of the wafer W.

The controller may sequentially perform a defect inspection using the camera sensor 240 and a defect inspection using the laser sensor 250. For example, the defect inspection using the camera sensor 240 may be performed first and then the defect inspection using the laser sensor 250 may be performed, or the defect inspection using the laser sensor 250 may be performed first and then the defect inspection using the camera sensor 240 may be performed. Or the defect inspection using the camera sensor 240 and the defect inspection using the laser sensor 250 may be performed at least partially at the same time. While the defect inspection using each of the camera sensor 240 and the laser sensor 250 is performed, the lighting device 260 may be maintained in a turned-on state.

In the embodiment shown in FIG. 3, the lighting device 260 may include a first lighting device 261 extending in the first direction and a second lighting device 262 extending in the second direction. The first lighting device 261, also described as a first lighting device component, may be disposed to be adjacent in the second direction to an imaging region that may be imaged by the camera sensor 240, and the second lighting device 262, also described as a second lighting device component, may be disposed to be adjacent in the first direction to the imaging region. However, the number of lighting devices 260 and an arrangement thereof may vary according to embodiments, and for example, the number and arrangement of the lighting devices 260 may vary according to a position and area of a partial region of the wafer W imaged by the camera sensor 240 through a single shutter operation.

For example, when the camera sensor 240 generates a sub-image representing one of the quadrants of the wafer W with one shot, each of the first lighting device 261 and the second lighting device 262 may irradiate the region including the quadrant imaged by the camera sensor 240 with light. A light source included in each of the first lighting device 261 and the second lighting device 262 may have a length greater than a radius of the wafer W so that a sufficient region including the quadrant may be irradiated with light.

For example, each of the first lighting device 261 and the second lighting device 262 may include a plurality of LEDs as a light source. A plurality of first LEDs included in the first lighting device 261 may be arranged in the first direction, and a plurality of second LEDs included in the second lighting device 262 may be arranged in the second direction. For example, the light source included in the first lighting device 261 may output light with a width of 1.5 times or more and 2.0 times or less of the radius of the wafer W in the first direction. Meanwhile, the light source included in the second lighting device 262 may output light with a width of 1.5 times or more and 2.0 times or less of the radius of the wafer W in the second direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 4:
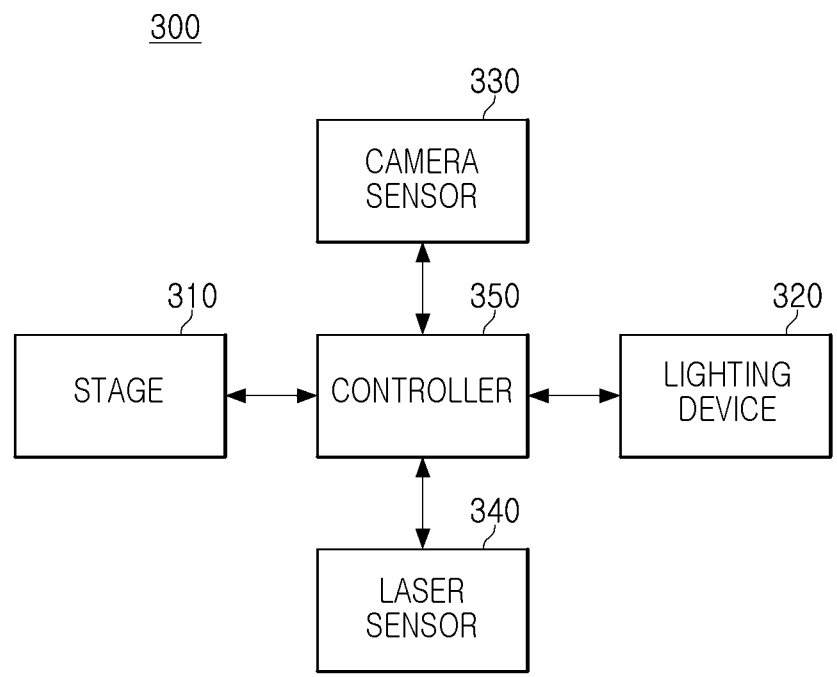
FIG. 4 is a schematic block diagram of a semiconductor processing device according to an embodiment of the present inventive concept.

FIG. 4 is a schematic block diagram of a semiconductor processing device according to an embodiment of the present inventive concept. The semiconductor processing device of FIG. 4 may be part of the semiconductor processing system 10 of FIG. 1.

Referring to FIG. 4, a semiconductor processing device 300 according to an embodiment of the present inventive concept may include a stage 310, a lighting device 320, a camera sensor 330, a laser sensor 340, a controller 350, and the like. The controller 350 may rotate a wafer seated on the stage 310 using the stage 310, and while the wafer rotates, the controller 350 may inspect a defect of the wafer using the camera sensor 330 and the laser sensor 340.

The controller 350 may turn on the lighting device 320 and image the wafer with the camera sensor 330 to inspect defects on the surface of the wafer. As described above, it may be difficult to obtain an image displaying the entire surface of the wafer by taking a single shot using the camera sensor 330. While rotating the wafer with the stage 310, the controller 350 may image different regions of the wafer two or more times with the camera sensor 330 to generate a plurality of sub-images, and combine the plurality of sub-images to acquire an original image displaying the entire surface of the wafer.

The controller 350 may include a machine learning model capable of determining wafer defects using the original image. For example, the machine learning model included in the controller 350 may be executed in a neural processor inside the controller 350 and may include a convolutional neural network useful for image processing. The convolutional neural network may include one or more convolutional layers and a general artificial neural network layer, and pre-processing may be performed in the convolutional layer.

For example, the machine learning model may include a plurality of convolutional layers and a fully connected layer processing outputs thereof. Each of the convolution layers may include a convolution module and a sub-sampling module. The convolution module may execute a convolution operation by applying one or more kernels to a feature map extracted from an input image, and change values of the feature map to nonlinear values by applying an activation function, such as ReLU, to a result of the convolution operation. The sub-sampling module may perform sub-sampling to reduce a size of the feature map output by the convolution module. The sub-sampling module may also be defined as a pooling module, and as an example, the sub-sampling module may perform an operation, such as max pooling to select a maximum value from the feature map, average pooling to calculate an average from the values of the feature map, or the like. The machine learning model may be trained in advance using a data set including images of wafers having defects, such as scratches and cracks, on surface thereof and images of wafers having no defects on the surfaces thereof.

In addition, the controller 350 measures a distance to the wafer with a laser sensor 330, while rotating the wafer using the stage 310, and inspects curve of the wafer. For example, when the difference between the distance measured by the laser sensor 330 and a preset reference distance is excessively large or small, the controller 350 may recognize that the wafer is curved enough to be judged as defective (e.g., due to warpage).

Figure 5:
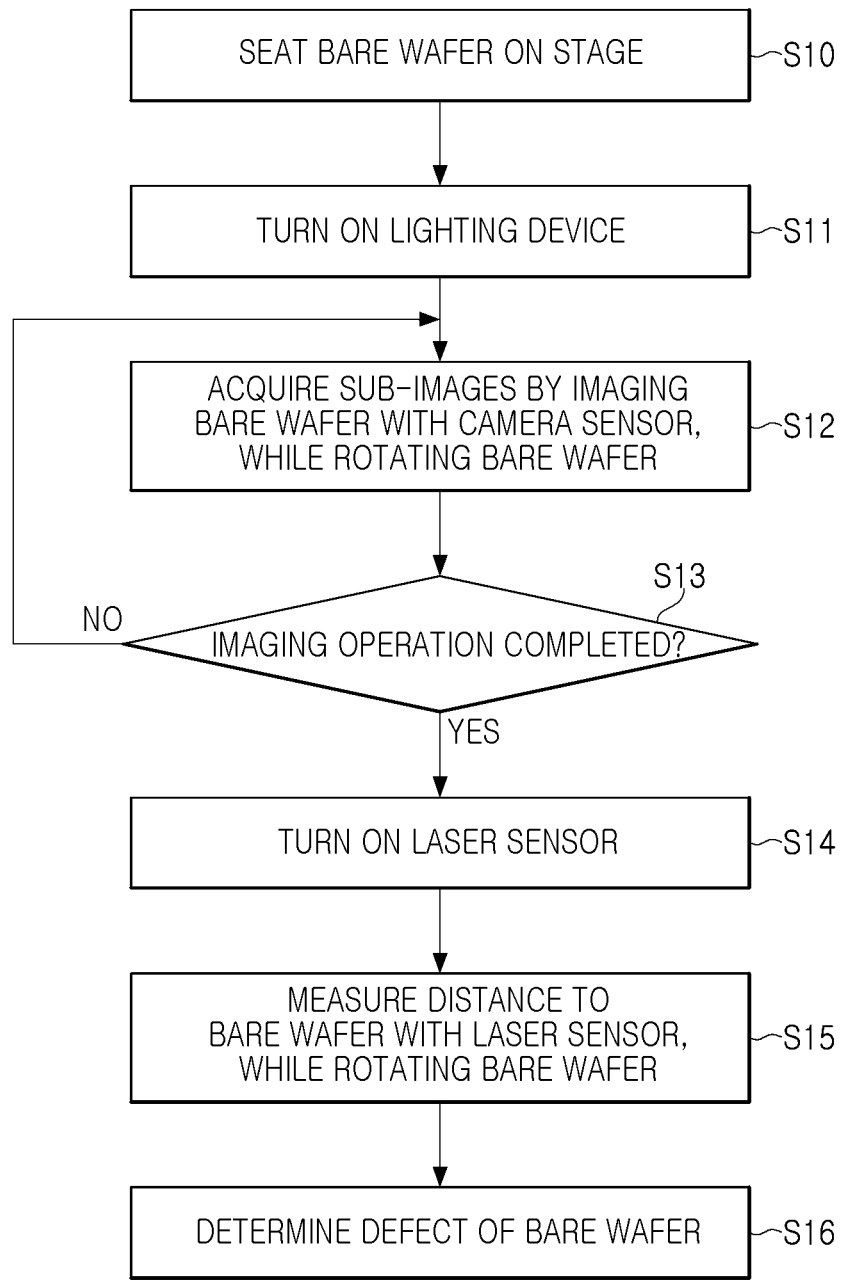
FIGS. 5 and 6 are flowcharts illustrating an operation of a semiconductor processing device according to an example embodiment of the present inventive concept.
Figure 6:
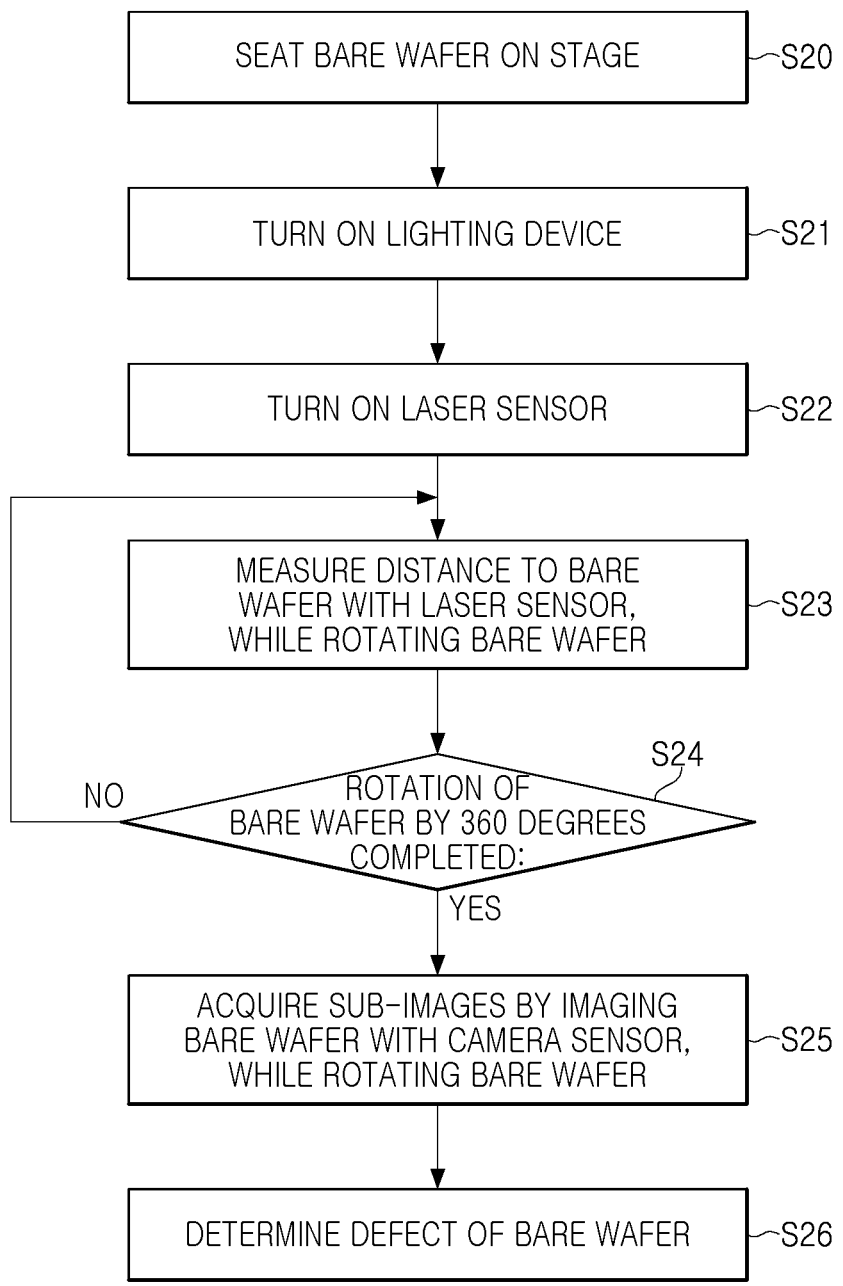

FIGS. 5 and 6 are flowcharts illustrating an operation of a semiconductor processing device according to an example embodiment of the present inventive concept.

First, referring to FIG. 5, the operation of the semiconductor processing device according to an embodiment of the present inventive concept may start with seating a bare wafer on a stage (S10). The semiconductor processing device according to an embodiment of the present inventive concept may include an aligner recognizing a flat zone or a notch included in the bare wafer and aligning the bare wafer in a predetermined direction. When the bare wafer is seated on the stage, the controller of the semiconductor processing device may turn on the lighting device (S11). The lighting device may be mounted over the stage and may radiate at least a partial region of the bare wafer seated on the stage with light.

When the lighting device is turned on, the controller may image the bare wafer with the camera sensor, while rotating the bare wafer by controlling the stage, to acquire a plurality of sub-images (S12). Meanwhile, the controller may determine whether the imaging operation using the camera sensor is completed (S13). For example, in operation S13, the controller may determine whether the imaging operation is completed according to whether the imaging operation using the camera sensor has been performed, while rotating the bare wafer by 360 degrees or more using the stage. Also, according to an embodiment, the controller may determine whether the imaging operation is completed depending on whether the imaging operation has been performed by the number of times of imaging determined according to the angle of view of the camera sensor. When it is determined that the imaging operation is not completed in operation S13, the controller may repeat the operation of imaging the bare wafer with the camera sensor, while rotating the bare wafer.

When it is determined that the imaging operation is completed in operation S13, the controller may turn on the laser sensor (S14). The laser sensor may output a laser in a direction, orthogonal to an upper surface of the bare wafer, and a distance to the upper surface of the bare wafer may be measured upon receiving a laser reflected from the upper surface of the bare wafer. While rotating the bare wafer again, the controller may measure the distance to the upper surface of the bare wafer multiple times with the laser sensor (S15). If there is an unintended curve or warpage of the bare wafer, the distance measured by the laser sensor may not be maintained to be constant and may increase or decrease.

The controller may determine defects of the bare wafer using the plurality of sub-images obtained in operation S12 and the distance measured in operation S15 (S16). When the distance measured in operation S15 is not constant and increases or decreases, the controller may determine that a curve exists in the bare wafer at a corresponding point. In addition, the controller may generate an original image displaying the entire upper surface of the bare wafer from the plurality of sub-images acquired in operation S12, and input the generated original image into the machine learning model to determine whether there are defects, such as scratches and cracks, on the bare wafer.

According to embodiments, the operation of determining defects of the bare wafer may be performed simultaneously with operation S15. When it is determined that the imaging operation is completed in operation S13, the controller may determine defects, such as scratches and cracks, by inputting the original image generated from the plurality of sub-images into the machine learning model, while measuring the distance to the bare wafer with the laser sensor by rotating the bare wafer.

Next, referring to FIG. 6, the operation of the semiconductor processing device according to an embodiment of the present inventive concept may start with seating a bare wafer on a stage (S20). As described above, the semiconductor processing device according to an embodiment of the present inventive concept may include an aligner. When the bare wafer is seated on the stage, the controller of the semiconductor processing device may turn on the lighting device (S21) and then turn on the laser sensor (S22). After the laser sensor is turned on, the controller may measure a distance to the bare wafer with the laser sensor, while rotating the bare wafer (S23).

While rotating the bare wafer, the controller may determine whether a rotation angle of the bare wafer reaches 360 degrees (S24). When it is determined that a 360-degree rotation of the bare wafer is completed in operation S24, the controller may turn on the camera sensor and image the bare wafer with the camera sensor, while rotating the bare wafer again. While the bare wafer rotates, the controller may acquire a plurality of sub-images by imaging the bare wafer multiple times with the camera sensor (S25). The plurality of sub-images may be images output by the camera sensor in a state in which a plurality of bare wafers are rotated at different rotation angles, and thus, the plurality of sub-images may be captured images of different regions of the plurality of bare wafers.

When the imaging operation using the camera sensor is completed, the controller may determine defects of the bare wafer (S26). For example, while performing the operation S25 of imaging the bare wafer using the camera sensor, the controller may determine defects, such as a curve of the bare wafer, first using the distance measured in operation S23.

Figure 16:
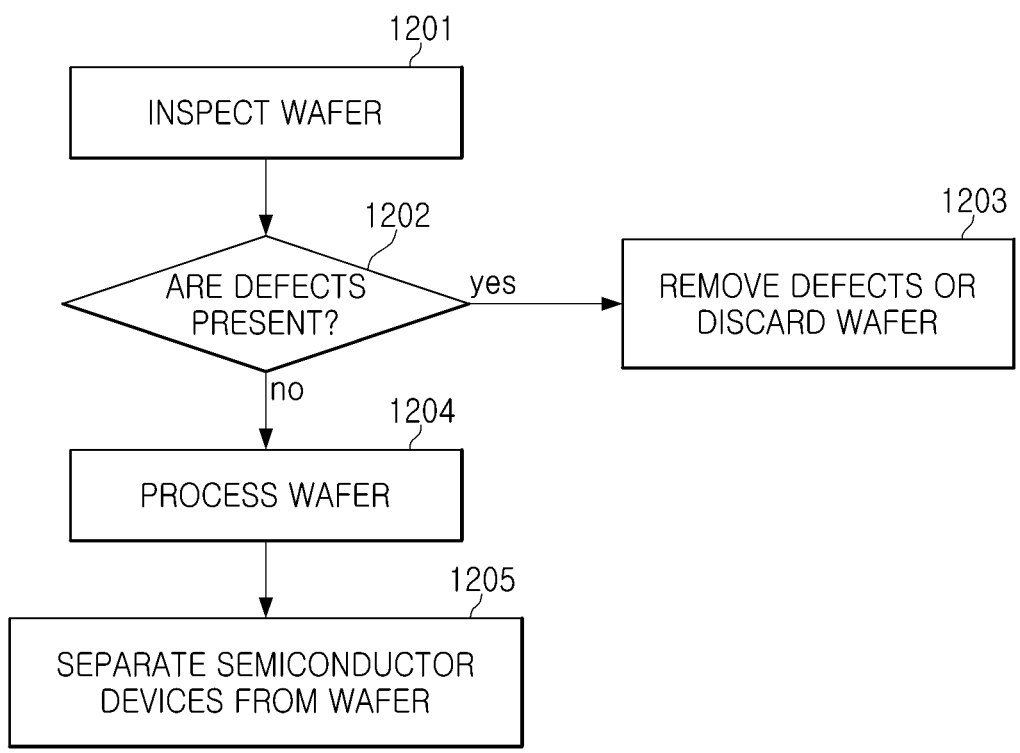
FIG. 16 is a flowchart showing a method of manufacturing a semiconductor device according to an example embodiment of the present inventive concept.

FIG. 16 is a flowchart showing a method of manufacturing a semiconductor device using the semiconductor processing system 10 of FIGS. 1 and/or the semiconductor processing devices 100 or 300 of FIGS. 2 and 4. Reference to items in FIGS. 1-4 is made in describing the method. In step 1201, a semiconductor wafer is inspected, for example, using an aligner 33/130/200 equipped with a camera sensor and laser, as discussed in the above embodiments. In step 1202, it is determined whether the semiconductor wafer has defects. If yes, in step 1203 the semiconductor wafer is moved to a different process chamber 60 to remove the defects, or is moved through an unload chamber 42 to be discarded. If no, in step S1204, the semiconductor wafer is moved to one or more different process chambers 60 for processing. For example, one or more of a deposition process, an etching process, an exposure process, an annealing process, a polishing process, an ion implantation process, and the like, are performed, to form a semiconductor device, such as a semiconductor chip, on the wafer. In step S1205, semiconductor devices formed on the wafer are separated from each other, to form individual semiconductor devices. The individual semiconductor devices may be, for example, memory chips or logic chips, and may be further included in a semiconductor device such as a semiconductor package.

FIGS. 7 to 11 are diagrams illustrating an operation of a semiconductor processing device according to an example embodiment of the present inventive concept.

Figure 7:
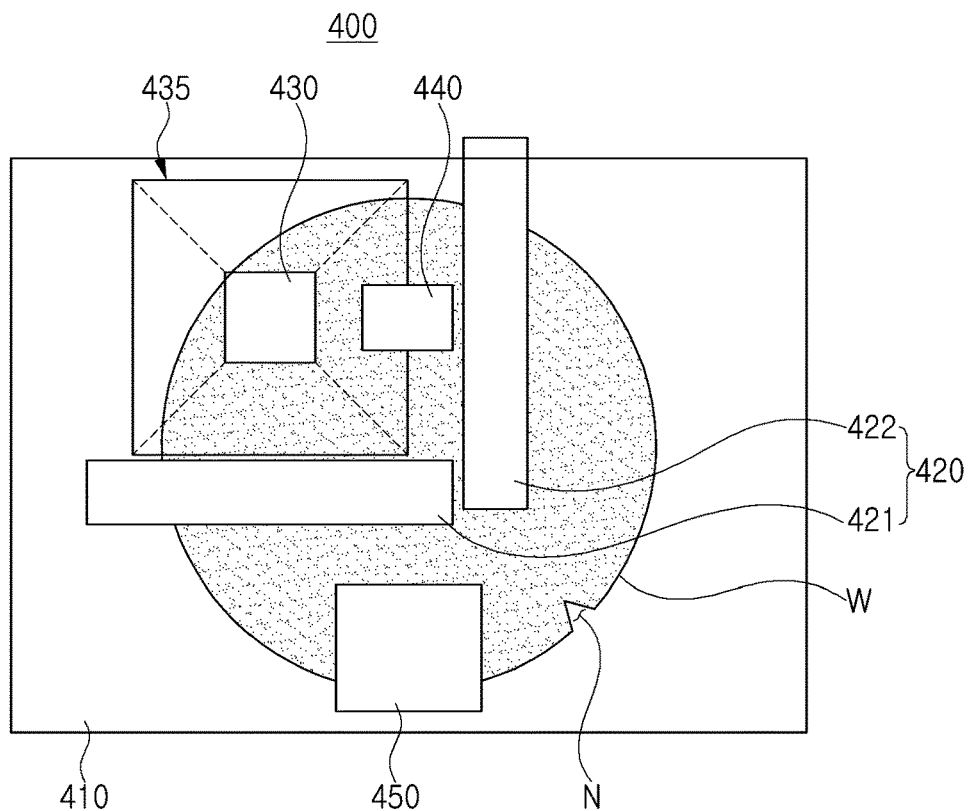
FIGS. 7 to 11 are diagrams illustrating an operation of a semiconductor processing device according to an example embodiment of the present inventive concept.
Figure 8:
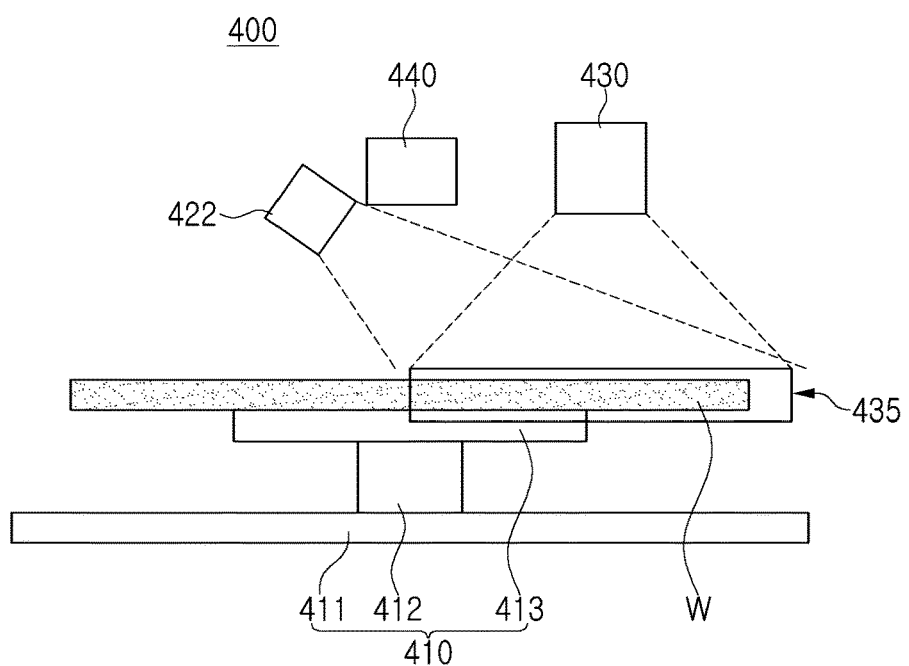

First, referring to FIGS. 7 and 8, a semiconductor processing device 400 according to an embodiment of the present inventive concept may include a stage 410 on which a wafer W is seated, and a lighting device 420, a camera sensor 430, a laser sensor 440, an aligning sensor 450, and the like disposed above the stage 410. The stage 410 may include a lower stage 411, a driving unit 412, an upper stage 413, and the like. The wafer W may be rotated by the driving unit 412, while being seated on the upper stage 413. In the embodiment shown in FIG. 7, the camera sensor 430 may be disposed in a position in which one of the quadrants of the wafer W may be imaged with one shot (single imaging), and the laser sensor 440 may be disposed to be adjacent to the camera sensor 430.

The lighting device 420 may include a first lighting device 421 extending in a first direction (a horizontal direction) and a second lighting device 422 extending in a second direction (a vertical direction). The lighting device 420 may radiate an imaging region 435 covered by the camera sensor 430 in single imaging with light in different directions. A length of a light source included in each of the first lighting device 421 and the second lighting device 422 may be longer than the radius of the wafer W, and therefore, light may be projected in a region wider than the imaging region 435. The laser sensor 440 may also be disposed over a region irradiated with light by the lighting device 420.

The wafer W may be a bare wafer, and an upper surface of the wafer W imaged by the camera sensor 430 may have a very high reflectivity. Therefore, light output from each of the first lighting device 421 and the second lighting device 422 may be irradiated to the upper surface of the wafer W, while having a certain incident angle, so that light reflected from the upper surface of the wafer W is not reflected in the image captured by the camera sensor 430 in each of the first lighting device 421 and the second lighting device 422. For example, a first incident angle of light output from the first lighting device 421 may be equal to a second incident angle of light output from the second lighting device 422.

The aligning sensor 450 may recognize a notch N or a flat zone existing on the wafer W and align the wafer W in a predetermined direction. For example, in the embodiment shown in FIG. 7, in a state in which the wafer W is rotated in a direction in which the aligning sensor 450 may recognize the notch N, the wafer W may be withdrawn externally by the wafer transfer robot from the semiconductor processing device 400.

When the wafer W is seated on the upper stage 413 as shown in FIG. 7, the controller of the semiconductor processing device 400 may turn on the lighting device 420 and then perform an imaging operation using the camera sensor 430. A first sub-image may be generated by an imaging operation performed in a state in which the first quadrant among the quadrants of the wafer W is located in the imaging region 435.

Figure 9:
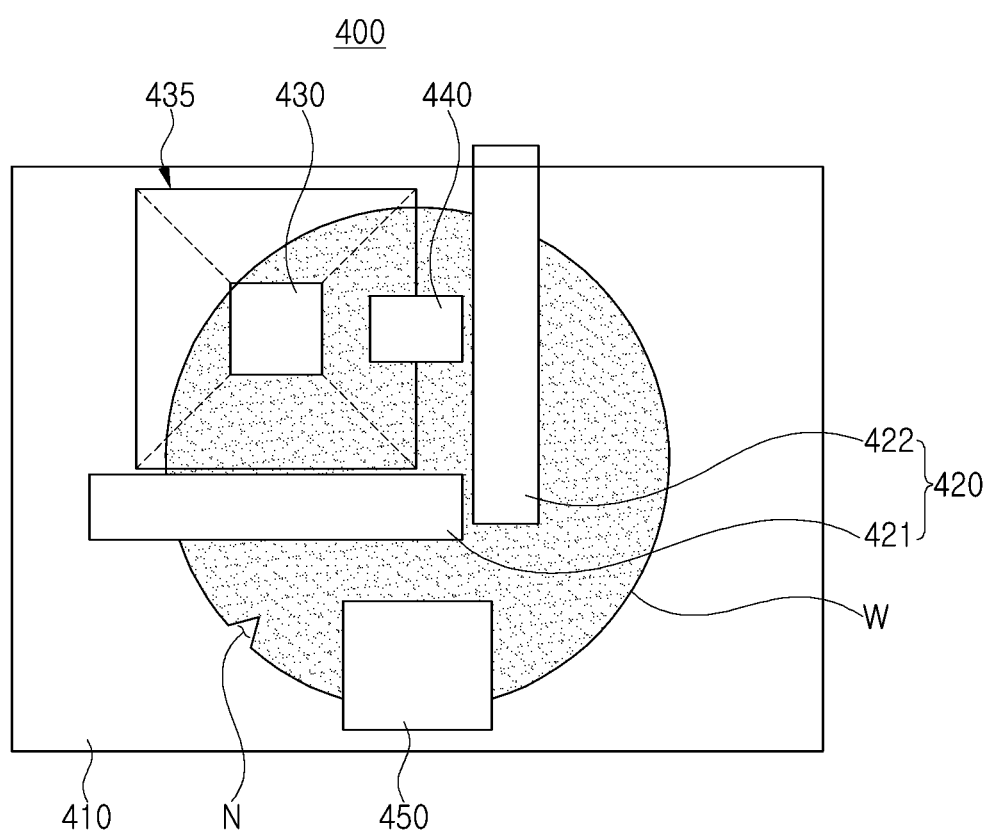

When the first sub-image is generated, as shown in FIG. 9, the controller may rotate the wafer by 90 degrees by driving the driving unit 412 to set a second quadrant, which is different from the first quadrant, to be located in the imaging region 435. When the second quadrant is located in the imaging region 435, the controller may acquire a second sub-image representing the second quadrant by imaging the imaging region 435 with the camera sensor 430.

Figure 10:
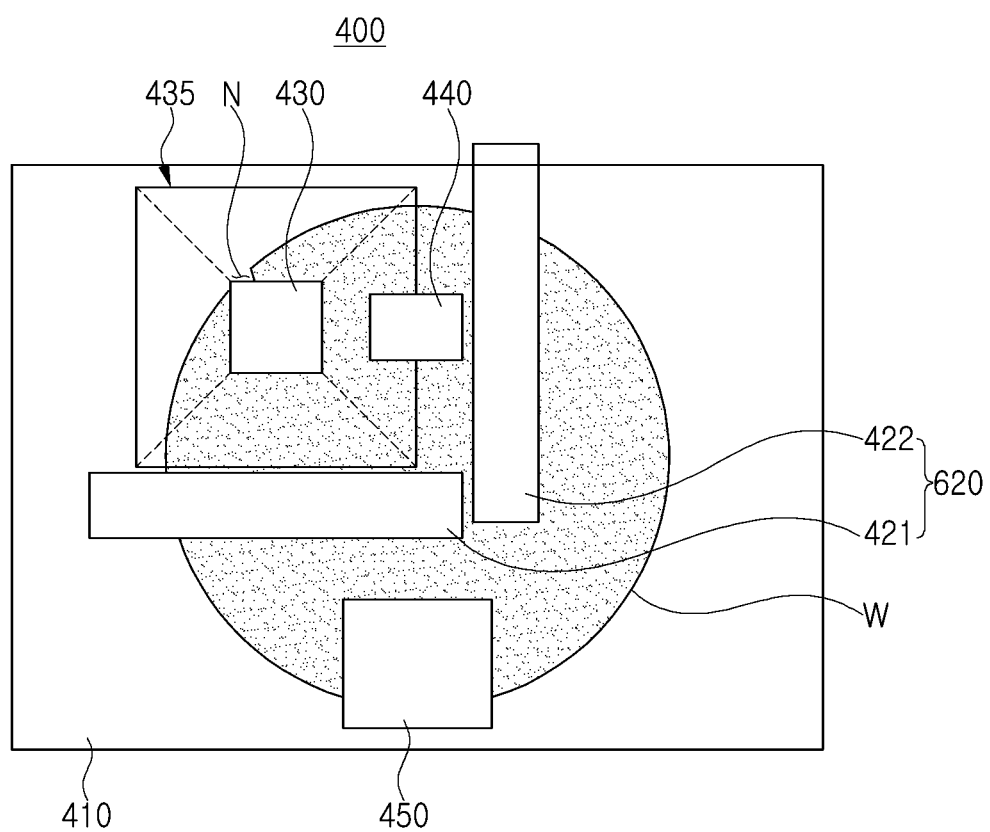
Figure 11:
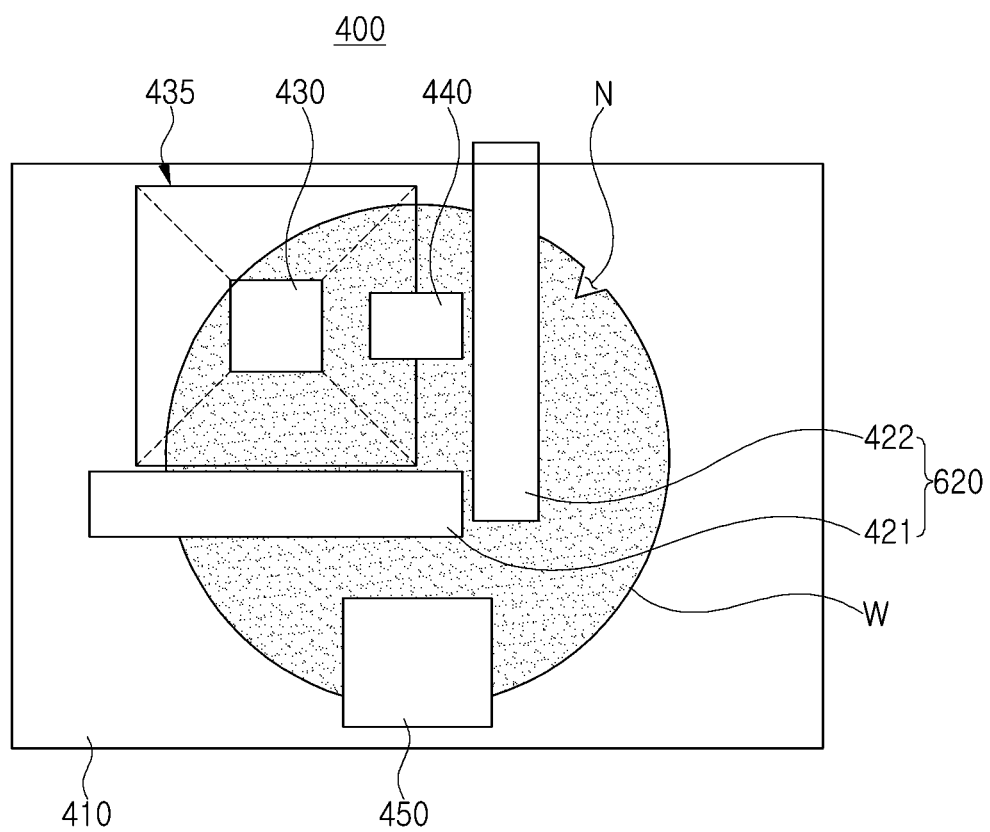

Next, the controller may further rotate the wafer W by 90 degrees and set a third quadrant, which is different from the first and second quadrants, to be located in the imaging region 435 as shown in FIG. 10. The controller may acquire a third sub-image displaying the third quadrant by performing an imaging operation with the camera sensor 430 in a state in which the third quadrant is located in the imaging region 435. Thereafter, the controller may further rotate the wafer W by 90 degrees to set a fourth quadrant to be located in the imaging region 435 as shown in FIG. 11 and acquire a fourth sub-image corresponding to the fourth quadrant by operating the camera sensor 430.

Since the first to fourth sub-images respectively correspond to the first to fourth quadrants of the wafer W, the controller may configure a single original image representing the entire region of the wafer W by using the first to fourth sub-images. The controller may determine defects existing on the surface of the wafer W, such as scratches and cracks, by using the original image.

Figure 12:
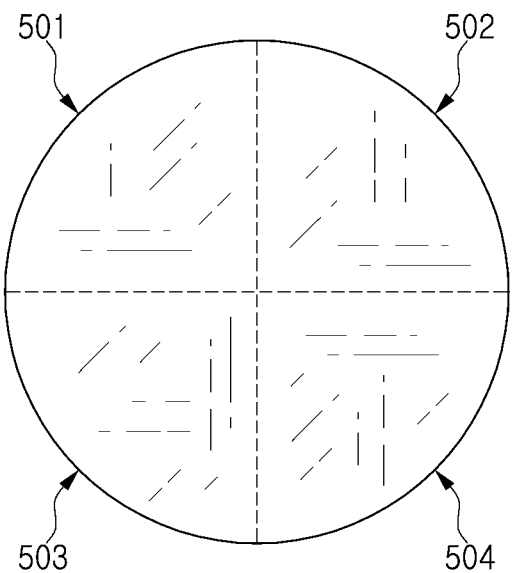
FIG. 12 is a diagram simply illustrating an image generated by a semiconductor processing device according to an embodiment of the present inventive concept.

FIG. 12 is a diagram briefly illustrating an original image generated by a semiconductor processing device according to an embodiment of the present inventive concept.

Referring to FIG. 12, a controller of a semiconductor processing device according to an embodiment of the present inventive concept may configure an original image 500 using first to fourth sub-images obtained by individually imaging first to fourth quadrants 501 to 504 of a wafer. Defects, such as scratches and cracks, on a surface of the wafer may be displayed in the original image 500.

The controller of the semiconductor processing device may determine the defects present on the surface of the wafer by inputting the original image 500 into a pre-trained machine learning model. As described above, the machine learning model may process the original image by extracting a feature map from the original image 500 and executing a convolution operation of applying kernels to the feature map, thereby detecting surface defects of the wafer.

Figure 13:
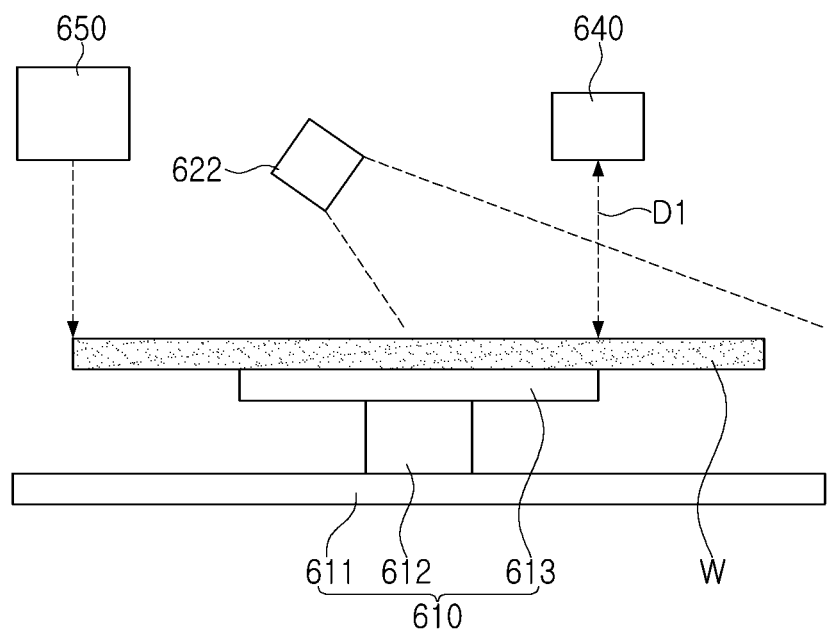
FIGS. 13 to 15 are diagrams illustrating an operation of a semiconductor processing device according to an example embodiment of the present inventive concept.
Figure 14:
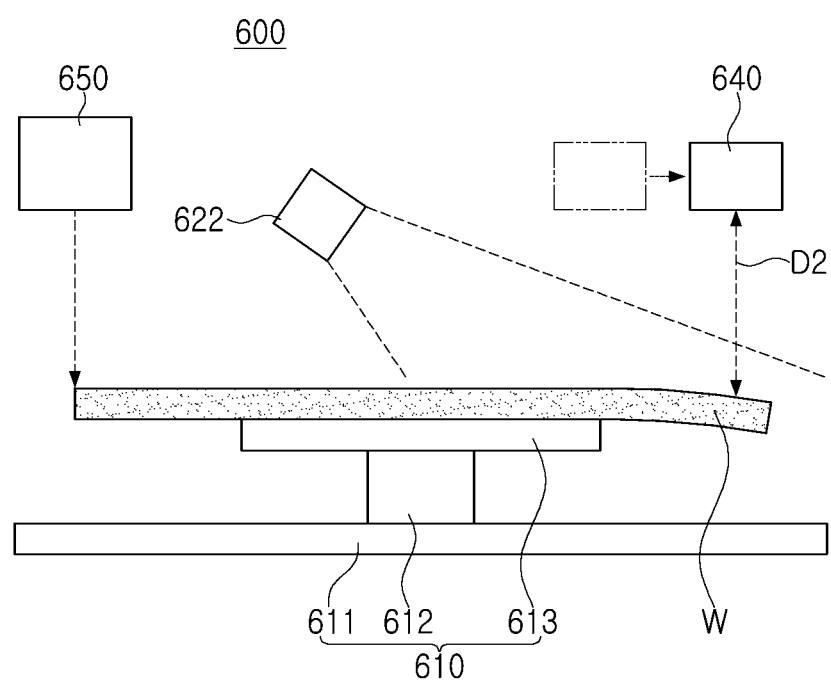
Figure 15:
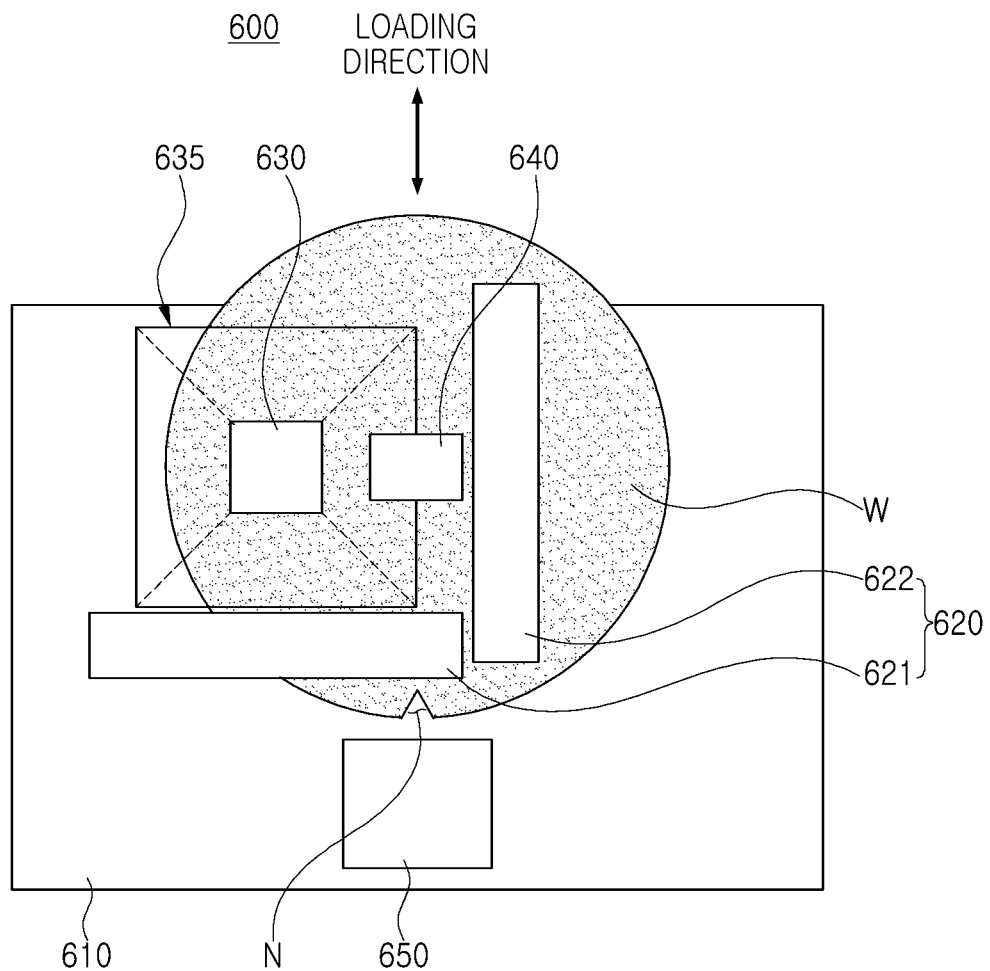

FIGS. 13 to 15 are diagrams illustrating an operation of a semiconductor processing device according to an example embodiment of the present inventive concept.

Referring to FIGS. 13 to 15, a semiconductor processing device 600 according to an embodiment of the present inventive concept may include a stage 610 on which a wafer W is placed, and a lighting device 620, a camera sensor 630, a laser sensor 640, an aligning sensor 650, and the like disposed above the stage 610. As described above with reference to FIGS. 7 to 11, the stage 610 may include a lower stage 611, a driving unit 612, an upper stage 613, and the like.

In an embodiment described above with reference to FIGS. 13 to 15, the controller of the semiconductor processing device 600 may inspect a curve of the wafer W using the laser sensor 640, while rotating the wafer W by using the driving unit 612. For example, as shown in FIG. 13, when there is no curve in the wafer W, it may be detected that a distance to the wafer W measured by the laser sensor 640 is not significantly different from a first distance D1, which is a reference distance. Meanwhile, as shown in FIG. 14, when a downward curve exists in a specific region of the wafer W, the distance to the wafer W measured by the laser sensor 640 may be measured to be a second distance D2, greater than the first distance D1. Meanwhile, if an upward curve exists in a specific region of the wafer W, the distance to the wafer W measured by the laser sensor 640 may be measured to be smaller than the first distance D1. In this manner, the controller may measure the distance with the layer sensor 640, while rotating the wafer W one or more turns and determine whether there is a curve in the wafer W and a position of a region in which the curve exists.

While the curve of the wafer W is inspected by the laser sensor 640, the lighting device 620 may be maintained in a turned-on state. In addition, while the wafer W is rotated one or more turns to inspect a curve of the wafer W, an operation of recognizing a notch N of the wafer W with the aligning sensor 850 may also be performed.

In addition, in order to inspect whether a curve exists in a large area of the wafer W with the laser sensor 640, the controller may adjust a position of the laser sensor 640 as shown in FIG. 14. For example, the controller may inspect a curve of the wafer W, while moving the laser sensor 640 in a direction, parallel to the upper surface of the wafer W, for example, in a radial direction of the wafer W.

When the operation of turning on the laser sensor 640 and inspecting the wafer W, while rotating the wafer W one or more turns, is completed, the semiconductor processing device 600 may rotate the wafer W by an alignment angle at which the notch N has been successfully recognized with the aligning sensor 650, while the wafer W is being rotated. For example, the controller may rotate the wafer W so that the notch N is located below the aligning sensor 650, after completing the inspection using the laser sensor 640. In a state in which the notch N is located below the aligning sensor 650, the wafer transfer robot enters the inside of the semiconductor processing device 600, grips the wafer W, and takes out the wafer W in a loading direction as shown in FIG. 15.

As a result, in an embodiment of the present inventive concept, defect inspection and direction alignment of the wafer W may be performed together in the semiconductor processing device 600 as a single device. Accordingly, there is no need to move the wafer W to a separate inspection location and perform a defect inspection, and therefore, overall process efficiency may be improved. In addition, by implementing a defect inspection function in the semiconductor processing device 600 providing an alignment function without a separate inspection location, overall manufacturing costs of the processing system performing a semiconductor process may be reduced.

According to an embodiment of the present inventive concept, the camera sensor and the laser sensor may be mounted on the aligner capable of rotating a wafer, and a first defect present on a surface of the wafer may be determined by configuring an original image displaying the entire region of the wafer with a plurality of sub-images obtained by imaging a partial region of the wafer with the camera sensor, while the wafer is being rotated. In addition, a second defect of the wafer due the warpage or the like may be determined by measuring a distance to the wafer with the laser sensor, while the wafer is being rotated. Therefore, since defects of the wafer may be detected while aligning the direction of the wafer, without separate inspection equipment, and prior to/without being placed in any process chamber, the efficiency of the semiconductor process may be improved.

While example embodiments have been shown and described above, it will be apparent to those skilled in the art that modifications and variations could be made without departing from the scope of the invention as defined by the appended claims.

What is claimed is:

1. A semiconductor processing device comprising:
in an equipment front end module (EFEM) for carrying a wafer on which a semiconductor process is to be performed into a load-lock chamber, a stage configured to receive a bare wafer placed thereon;
a laser sensor located above the stage in a vertical direction, perpendicular to an upper surface of the bare wafer;
a camera sensor located above the stage in the vertical direction;
a lighting device configured to radiate an imaging region imaged by the camera sensor with light; and
a controller configured to rotate the stage on which the bare wafer is placed, and configured to, while rotating the stage, obtain a plurality of sub-images of the bare wafer captured by the camera sensor to generate an original image of the bare wafer, and detect a first defect of the bare wafer using the original image,
wherein the controller is configured to detect a second defect of the bare wafer by measuring a distance between the laser sensor and the bare wafer, while rotating the stage on which the bare wafer is placed, and
wherein the controller is configured to detect the first defect while simultaneously measuring the distance between the laser sensor and the bare wafer.

2. The semiconductor processing device of claim 1, wherein:
the first defect includes at least one of scratches and cracks on a surface of the bare wafer, and the second defect includes warpage of the bare wafer.

3. The semiconductor processing device of claim 1, wherein:
the camera sensor is mounted in a position at which the camera sensor can image only a partial region of a surface of the wafer at a single time,
the controller is configured to rotate the stage by a first rotation angle and acquire a first sub-image of a first region of the surface of the bare wafer captured by the camera sensor, and
the controller is configured to rotate the stage by a second rotation angle, different from the first rotation angle, and acquire a second sub-image of a second region of the surface of the bare wafer captured by the camera sensor.

4. The semiconductor processing device of claim 3, wherein:
the plurality of sub-images include the first sub-image obtained by imaging a first quadrant of the bare wafer, the second sub-image obtained by imaging a second quadrant of the bare wafer, a third sub-image obtained by imaging a third quadrant of the bare wafer, and a fourth sub-image obtained by imaging a fourth quadrant of the bare wafer.

5. The semiconductor processing device of claim 1, wherein:
the imaging region has an area including at least one of four quadrants of the bare wafer.

6. The semiconductor processing device of claim 1, wherein:
the controller is configured to measure the distance between the laser sensor and the bare wafer, while rotating the stage, after acquiring the plurality of sub-images.

7. The semiconductor processing device of claim 1, wherein:
the controller is configured to acquire the plurality of sub-images, after measuring the distance between the laser sensor and the bare wafer, while rotating the stage.

8. The semiconductor processing device of claim 1, wherein the front end module further comprises:
an aligning sensor configured to recognize a flat zone or a notch included in the bare wafer,
wherein the controller is configured to align the bare wafer in a predetermined direction based on a recognition result of the aligning sensor.

9. The semiconductor processing device of claim 1, wherein:
the lighting device includes a first lighting device extending in a first direction, parallel to a surface of the bare wafer, and disposed on one side of the imaging region in a second direction, intersecting the first direction, and a second lighting device extending in the second direction and disposed on one side of the imaging region in the first direction.

10. The semiconductor processing device of claim 9, wherein:
light output from the lighting device is incident on the surface of the bare wafer, while having a predetermined incident angle.

11. The semiconductor processing device of claim 10, wherein:
a first incident angle of light output from the first lighting device is equal to a second incident angle of light output from the second lighting device.

12. The semiconductor processing device of claim 9, wherein:
a first lighting region in which the first lighting device radiates the surface of the bare wafer with light has a width greater than a width of the imaging region in the first direction, and
a second lighting region in which the second lighting device radiates the surface of the bare wafer with light has a width greater than the width of the imaging region in the second direction.

13. The semiconductor processing device of claim 1, wherein:
a width of a lighting region in which the lighting device irradiates a surface of the bare wafer with light is 1.5 times or greater to and 2.0 times or less a radius of the bare wafer.

14. A semiconductor processing device comprising:
a wafer transfer robot including a hand unit for gripping a wafer and a driving unit connected to the hand unit for moving the wafer;
in an equipment front end module (EFEM) for carrying a wafer on which a semiconductor process is to be performed into a load-lock chamber, an aligner including a stage configured on which to seat the wafer, a camera sensor installed above the stage to image a partial region of the wafer at a time, and a laser sensor installed above the stage to measure a distance to a surface of the wafer; and
a controller configured to control the wafer transfer robot and the aligner,
wherein the controller is configured such that, when the wafer is seated on the stage:
the controller aligns the wafer,
the controller acquires a plurality of sub-images of the surface of the wafer captured by the camera sensor, while rotating the wafer using the stage, each sub-image being a quadrant of the wafer captured by the camera sensor without capturing other quadrants of the wafer, combines the different quadrants to form an image of the entire wafer, and determines a surface defect of the wafer based on the image of the entire wafer, and the controller determines a curve defect of the wafer based on a distance to the surface of the wafer measured by the laser sensor, while rotating the wafer using the stage.

15. The semiconductor processing device of claim 14, wherein:

the controller is configured to align the wafer in a predetermined direction by rotating the wafer using the stage, when the determination of the surface defect and the curve defect is completed.

16. The semiconductor processing device of claim 15, wherein:

the controller is configured such that, when the wafer is aligned, the controller controls the wafer transfer robot to introduce the wafer into at least one of a process chamber and a transfer chamber.

17. The semiconductor processing device of claim 14, wherein:

the aligner further includes a first lighting device and a second lighting device for radiating an imaging region of the camera sensor with light, and a plurality of first light sources included in the first lighting device are arranged in a first direction, parallel to a surface of the wafer, and a plurality of second light sources included in the second lighting device are arranged in a second direction, parallel to the surface of the wafer and intersecting the first direction.

18. The semiconductor processing device of claim 14, further comprising:

a buffer for storing the wafer before the wafer is introduced into the aligner or after the wafer is carried out of the aligner; and a body to which the wafer transfer robot, the aligner, the buffer, and a front open unified pod (FOUP) accommodating a plurality of wafers including the wafer are connected, wherein the controller is disposed inside the body.

19. A semiconductor processing device comprising:

at least one process chamber configured to perform a semiconductor process on a wafer;

a wafer transfer robot configured to move the wafer transferred by a front open unified pod (FOUP);

an aligner configured to receive the wafer from the wafer transfer robot and rotate the wafer to align the wafer in a predetermined direction by recognizing a notch or a flat zone of the wafer;

a load-lock chamber configured to transfer the wafer between the process chamber and the wafer transfer robot; and a controller, wherein the aligner includes a stage for rotating the wafer, an aligning sensor mounted above the stage and configured to recognize the notch or the flat zone of the wafer, a lighting device mounted above the stage and configured to irradiate a partial region of the wafer with light, a camera sensor mounted above the stage and configured to image a partial region of the wafer, and a laser sensor mounted above the stage and configured to measure a distance to an upper surface of the wafer, wherein the camera sensor is located at a height that results in only a portion of the wafer being imaged, so that by rotating the wafer, different adjacent portions of the wafer are imaged, and wherein the controller is configured to acquire separate images for the different adjacent portions of the wafer, and to combine the separate images to form an image of the entire wafer in order to determine a surface defect of the wafer, while rotating the wafer by 360 degrees or more using the stage, and is further configured to measure a distance to the upper surface of the wafer with the laser sensor, and specify an alignment angle at which the aligning sensor recognizes the notch or the flat zone, by rotating the wafer on the stage.

20. The semiconductor processing device of claim 19, where:

the controller is configured to control the process chamber, the wafer transfer robot, the aligner, and the load-lock chamber.

* * * * *